United States Patent
Tanaka

(10) Patent No.: US 10,317,425 B2
(45) Date of Patent: Jun. 11, 2019

(54) FUNCTIONAL ELEMENT, ELECTRONIC APPARATUS, AND MOVING OBJECT

(71) Applicant: Seiko Epson Corporation, Tokyo (JP)

(72) Inventor: Satoru Tanaka, Chino (JP)

(73) Assignee: Seiko Epson Corporation (JP)

(*) Notice: Subject to any disclaimer, the term of this patent is extended or adjusted under 35 U.S.C. 154(b) by 151 days.

(21) Appl. No.: 14/628,587

(22) Filed: Feb. 23, 2015

(65) Prior Publication Data
US 2015/0241466 A1 Aug. 27, 2015

(30) Foreign Application Priority Data
Feb. 25, 2014 (JP) .................... 2014-034244

(51) Int. Cl.
*B81B 3/00* (2006.01)
*G01P 15/125* (2006.01)
*G01P 15/08* (2006.01)

(52) U.S. Cl.
CPC .......... *G01P 15/125* (2013.01); *B81B 3/0016* (2013.01); *G01P 2015/0874* (2013.01)

(58) Field of Classification Search
CPC .......... G01P 15/125; G01P 2015/0874; G01P 2015/0831; B81B 3/0016
USPC ..................................... 73/514.32
See application file for complete search history.

(56) References Cited

U.S. PATENT DOCUMENTS

| 5,488,864 | A | * | 2/1996 | Stephan | G01P 15/125 73/514.32 |
| 9,151,775 | B2 | * | 10/2015 | Yoda | G01P 15/125 |
| 2003/0115960 | A1 | | 6/2003 | Franz et al. | |
| 2005/0268719 | A1 | * | 12/2005 | Malametz | G01P 15/0802 73/514.32 |
| 2010/0122578 | A1 | * | 5/2010 | Classen | G01P 15/125 73/514.32 |
| 2013/0263662 | A1 | * | 10/2013 | Tanaka | G01P 1/003 73/504.12 |
| 2014/0208849 | A1 | * | 7/2014 | Zhang | G01P 15/125 73/514.32 |

FOREIGN PATENT DOCUMENTS

| FR | 2694403 A1 | 2/1994 |
| JP | 10-206457 A | 8/1998 |
| JP | 2003-519384 A | 6/2003 |

(Continued)

*Primary Examiner* — Lisa M Caputo
*Assistant Examiner* — Irving A Campbell
(74) *Attorney, Agent, or Firm* — Harness, Dickey & Pierce, P.L.C.

(57) ABSTRACT

A functional element includes: a substrate; a movable body that includes a movable electrode portion; a support portion that supports the movable body; a first fixed electrode portion that is disposed on the substrate and a portion of which faces a first portion as one of portions of the movable body; a second fixed electrode portion that is disposed on the substrate and a portion of which faces a second portion as the other portion of the movable body; and a third fixed electrode portion that is disposed on the substrate and a portion of which faces the first portion. An opening that faces a region of the substrate between the first fixed electrode portion and the third fixed electrode portion is provided in the movable body, and the width of the opening is equal to or more than the width of the region.

19 Claims, 7 Drawing Sheets

(56) References Cited

FOREIGN PATENT DOCUMENTS

| | | |
|---|---|---|
| JP | 2007-298405 A | 11/2007 |
| JP | 2009-537803 A | 10/2009 |
| JP | 2013-011549 A | 1/2013 |
| WO | WO-2007-131835 A1 | 11/2007 |

* cited by examiner

FUNCTIONAL ELEMENT, ELECTRONIC APPARATUS, AND MOVING OBJECT

CROSS-REFERENCE TO RELATED APPLICATION

This application claims priority to Japanese Patent Application No. 2014-034244 filed on Feb. 25, 2014. The entire disclosure of Japanese Patent Application No. 2014-034244 is hereby incorporated herein by reference.

BACKGROUND

1. Technical Field

The present invention relates to a functional element, an electronic apparatus, and a moving object.

2. Related Art

In recent years, functional elements (physical quantity sensors) that detect a physical quantity such as acceleration have been developed using, for example, a silicon MEMS (Micro Electro Mechanical Systems) technique.

For example, JP-A-2007-298405 discloses an electrostatic capacitive sensor including a first movable electrode and a first fixed electrode. The first movable electrode is movably supported to a fixed portion of a semiconductor layer via a beam portion so as to have an asymmetric mass balance, and operates in response to a change in physical quantity in the thickness direction of the semiconductor layer. The first fixed electrode is formed on a support substrate that supports the semiconductor layer. The first movable electrode and the first fixed electrode are disposed to face each other via a gap. The electrostatic capacitive sensor detects a physical quantity based on an electrostatic capacitance detected according to the size of the gap between the first movable electrode and the first fixed electrode.

In such a functional element, in the manufacture of the functional element for example, a potential difference occurs between the movable electrode and the support substrate, the movable electrode is attracted to the support substrate side with an electrostatic force, and therefore, the movable electrode sticks to the support substrate in some cases. Especially when a lid (cap) for sealing the movable electrode and the support substrate are anodically bonded together, a large potential difference occurs between the movable electrode and the support substrate, which is problematic.

In the electrostatic capacitive sensor disclosed in JP-A-2007-298405, a stopper for avoiding direct contact with the support substrate is provided on a surface of the movable electrode facing the support substrate for preventing the movable electrode from sticking to the substrate.

In the electrostatic capacitive sensor disclosed in JP-A-2007-298405, however, since a surface of the support substrate facing the movable electrode has a large exposed region, the movable electrode sticks to the support substrate in some cases due to an electrostatic force between the exposed region and the movable electrode.

SUMMARY

An advantage of some aspects of the invention is to provide a functional element in which sticking of a movable body to a substrate can be reduced. Moreover, another advantage of some aspects of the invention is to provide an electronic apparatus and a moving object both including the functional element.

The invention can be implemented as the following forms or application examples.

Application Example 1

A functional element according to this application example includes: a substrate; a movable body that includes a movable electrode portion; a support portion that supports the movable body so as to be displaceable about a first axis; a first fixed electrode portion that is disposed on the substrate and at least a portion of which faces a first portion as one of portions of the movable body divided by the first axis as a boundary; a second fixed electrode portion that is disposed on the substrate and at least a portion of which faces a second portion as the other portion of the movable body divided by the first axis as a boundary; and a third fixed electrode portion that is disposed on the substrate and at least a portion of which faces the first portion, wherein the first fixed electrode portion is disposed between the second fixed electrode portion and the third fixed electrode portion in a plan view, an opening that faces a region of the substrate between the first fixed electrode portion and the third fixed electrode portion is provided in the movable body, and the width of the opening is equal to or more than the width of the region.

In the functional element, an electrostatic force to be generated between the movable body and the substrate is suppressed due to the opening provided in the movable body, so that sticking of the movable body to the substrate can be reduced. Hence, in the manufacture of the functional element for example, it is possible in the functional element to reduce a problem in that a potential difference occurs between the movable body and the substrate, the movable body is attracted to the substrate side with an electrostatic force, and thus the movable body sticks to the substrate.

Application Example 2

In the functional element according to the application example, the third fixed electrode portion may be electrically connected with the movable body.

In the functional element with this configuration, it is possible to easily reduce a potential difference between the third fixed electrode portion and the movable body. Hence, an electrostatic force to be generated between the movable body and the substrate is suppressed, so that sticking of the movable body to the substrate can be reduced.

Application Example 3

In the functional element according to the application example, the opening may overlap the first fixed electrode portion, the region, and the third fixed electrode portion in the plan view.

In the functional element with this configuration, an electrostatic force to be generated between the movable body and the substrate is more reliably suppressed, so that sticking of the movable body to the substrate can be reduced.

Application Example 4

In the functional element according to the application example, a slit portion that penetrates the movable body may be provided in the movable body, a distance between a portion of the slit portion and the first axis may be larger than a distance between the opening and the first axis in the plan view, and the width of the slit portion may be smaller than the width of the opening.

In the functional element with this configuration, torque can be gained while reducing damping in the movable body. Hence, for example, detection sensitivity can be increased in the functional element.

Application Example 5

In the functional element according to the application example, the length of the slit portion may be smaller than the length of the opening.

In the functional element with this configuration, the mass of the movable body can be increased while reducing the influence of damping.

Application Example 6

In the functional element according to the application example, a plurality of the slit portions may be provided, and arranged in a direction of the first axis.

In the functional element with this configuration, the mass of the movable body can be increased while reducing the influence of damping.

Application Example 7

In the functional element according to the application example, the opening may penetrate the movable body.

In the functional element with this configuration, compared to when, for example, the opening does not penetrate the movable body, an electrostatic force to be generated between the movable body and the substrate can be suppressed. Hence, sticking of the movable body to the substrate can be further reduced in the functional element.

Application Example 8

In the functional element according to the application example, the opening may be a recess that is provided in a surface of the movable body on the substrate side.

In the functional element with this configuration, an electrostatic force to be generated between the movable body and the substrate is suppressed due to the opening provided in the movable body, so that sticking of the movable body to the substrate can be reduced.

Application Example 9

In the functional element according to the application example, the material of the substrate may be glass, and the material of the movable body may be silicon.

In the functional element with this configuration, it is easily possible to electrically insulate the substrate and the movable body from each other, and the structure of the functional element can be simplified.

Application Example 10

In the functional element according to the application example, the width of the opening may be the size of the opening in a direction of a second axis orthogonal to the first axis, and the width of the region may be the size of the region in the direction of the second axis.

In the functional element with this configuration, an electrostatic force to be generated between the movable body and the substrate is suppressed due to the opening provided in the movable body, so that sticking of the movable body to the substrate can be reduced.

Application Example 11

An electronic apparatus according to this application example includes any of the functional elements described above.

The electronic apparatus includes any of the functional elements and therefore can have high reliability.

Application Example 12

A moving object according to this application example includes any of the functional elements described above.

The moving object includes any of the functional elements and therefore can have high reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, preferred embodiments of the invention will be described in detail with reference to the drawings. The embodiments described below do not unduly limit the contents of the invention set forth in the appended claims. Moreover, not all of the configurations described below are indispensable configuration requirements of the invention.

1. First Embodiment

1.1. Functional Element

Figure 1:
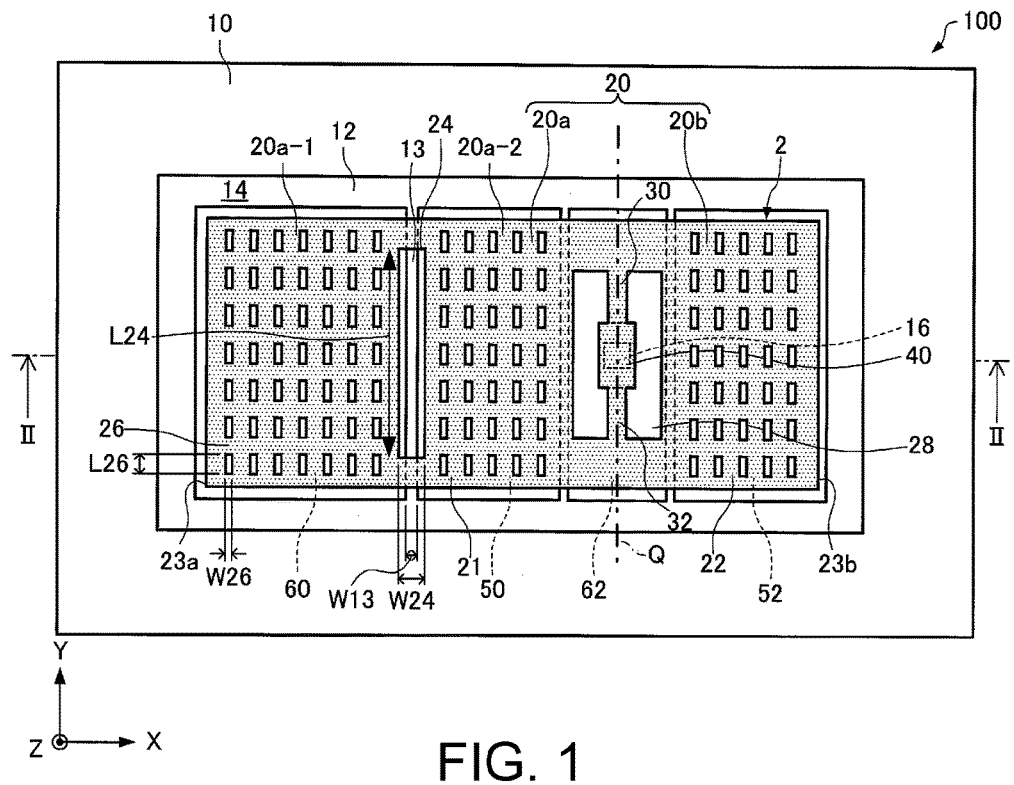
FIG. 1 is a plan view schematically showing a functional element according to a first embodiment.
Figure 2:
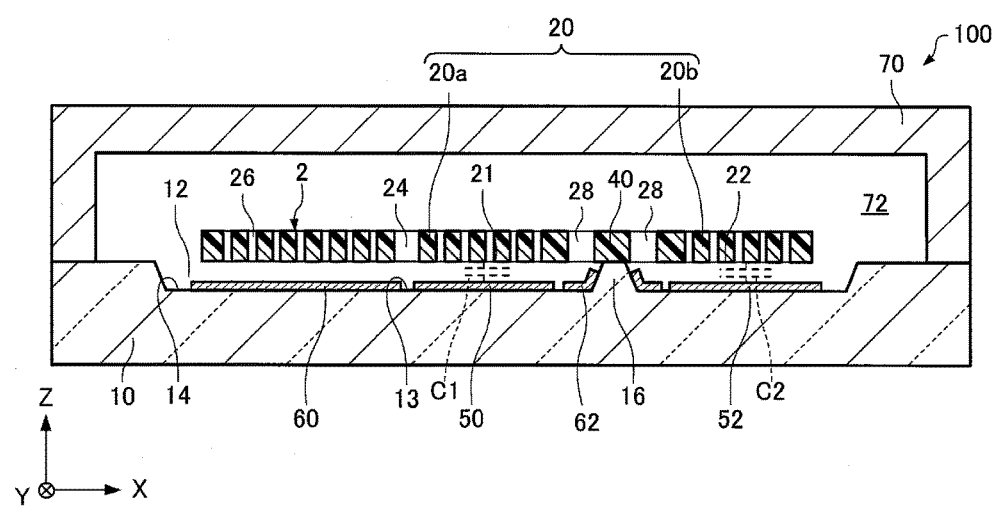
FIG. 2 is a cross-sectional view schematically showing the functional element according to the first embodiment.

First, a functional element according to a first embodiment will be described with reference to the drawings. FIG. 1 is a plan view schematically showing a functional element 100 according to the first embodiment. FIG. 2 is a cross-sectional view taken along the line II-II in FIG. 1, schematically showing the functional element 100 according to the first embodiment. In FIGS. 1 and 2, an X-axis, a Y-axis, and a Z-axis are illustrated as three axes orthogonal to each other. Also in the drawings shown below, the X-axis, the Y-axis, and the Z-axis are illustrated similarly.

As shown in FIGS. 1 and 2, the functional element 100 includes a substrate 10, a movable body 20, support portions 30 and 32, a fixed portion 40, a first fixed electrode portion 50, a second fixed electrode portion 52, a third fixed electrode portion (hereinafter also referred to as "first dummy electrode portion") 60, a fourth fixed electrode portion (hereinafter also referred to as "second dummy electrode portion") 62, and a lid 70. For convenience sake, the lid 70 is not illustrated in FIG. 1.

Hereinafter, an example in which the functional element 100 is an acceleration sensor (electrostatic capacitive MEMS acceleration sensor) that detects acceleration in the vertical direction (Z-axis direction) will be described.

The material of the substrate 10 is, for example, an insulating material such as glass. For example, with the use of an insulating material such as glass for the substrate 10 and a semiconductor material such as silicon for a structure 2 including the movable body 20, the support portions 30 and 32, and the fixed portion 40, it is easily possible to electrically insulate the substrate 10 and the structure 2 from each other, and thus the structure of the functional element 100 can be simplified.

A recess 12 is formed in the substrate 10. The planar shape (shape viewed from the Z-axis direction) of the recess 12 is, for example, a rectangle. A post portion 16 is provided on a bottom surface (surface of the substrate 10 defining the recess 12) 14 of the recess 12. The post portion 16 protrudes above (the positive Z-axis direction) the bottom surface 14. The height of the post portion 16 and the depth of the recess 12 are, for example, equal to each other.

The movable body 20 is provided above the recess 12. A gap is provided between the movable body 20 and the substrate 10. That is, the movable body 20 is spaced apart from the substrate 10. The movable body 20 is connected via the support portions 30 and 32 to the fixed portion 40 that is fixed to the substrate 10.

The movable body 20 is displaceable about a support axis (first axis) Q. Specifically, when the acceleration in the vertical direction (Z-axis direction) is applied, the movable body 20 swings in a seesaw manner with the support axis Q determined by the support portions 30 and 32 as the axis of rotation (swing axis). The support axis Q is parallel to the Y-axis in the illustrated example. The planar shape of the movable body 20 is, for example, a rectangle. The thickness (size in the Z-axis direction) of the movable body 20 is, for example, constant.

The movable body 20 includes a first seesaw piece (first portion) 20a and a second seesaw piece (second portion) 20b. The first seesaw piece 20a is one (a portion located on the negative X-axis direction side of the support axis Q in the illustrated example) of two portions of the movable body 20 divided by the support axis Q in a plan view (viewed from the thickness direction of the substrate 10 or viewed from the Z-axis direction). The second seesaw piece 20b is the other (a portion located on the positive X-axis direction side of the support axis Q in the illustrated example) of the two portions of the movable body 20 divided by the support axis Q in the plan view. That is, the movable body 20 is divided into the first seesaw piece 20a and the second seesaw piece 20b by the support axis Q as a boundary.

For example, when the acceleration in the vertical direction (for example, gravitational acceleration) is applied to the movable body 20, rotation moment (moment of force) occurs in each of the first seesaw piece 20a and the second seesaw piece 20b. Here, when the rotation moment (for example, counterclockwise rotation moment) of the first seesaw piece 20a and the rotation moment (for example, clockwise rotation moment) of the second seesaw piece 20b are balanced, there is no change in the inclination of the movable body 20, and thus the acceleration cannot be detected. Hence, the movable body 20 is designed such that when the acceleration in the vertical direction is applied, the rotation moment of the first seesaw piece 20a and the rotation moment of the second seesaw piece 20b are not balanced, and thus a predetermined inclination of the movable body 20 is caused.

In the functional element 100, the mass of the first seesaw piece 20a is made different from the mass of the second seesaw piece 20b, whereby the rotation moment of the first seesaw piece 20a is not balanced with the rotation moment of the second seesaw piece 20b when the acceleration in the vertical direction is applied, and thus a predetermined inclination of the movable body 20 is caused. That is, in the functional element 100, the support axis Q is disposed at a position deviated from the center of gravity of the movable body 20. In the illustrated example, a distance between an end face 23a of the first seesaw piece 20a and the support axis Q is larger than a distance between an end face 23b of the second seesaw piece 20b and the support axis Q in the plan view, and the thickness of the first seesaw piece 20a and the thickness of the second seesaw piece 20b are equal to each other. With this configuration, the mass of the first seesaw piece 20a is larger than the mass of the second seesaw piece 20b, so that the mass of the first seesaw piece 20a is different from the mass of the second seesaw piece 20b.

Although not illustrated, the seesaw pieces 20a and 20b may have different masses from each other by making the distance between the end face 23a of the first seesaw piece 20a and the support axis Q equal to the distance between the end face 23b of the second seesaw piece 20b and the support axis Q in the plan view and by making the thicknesses of the seesaw pieces 20a and 20b different from each other. Even in such a case, when the acceleration in the vertical direction is applied, a predetermined inclination of the movable body 20 can be caused.

The movable body 20 includes a first movable electrode portion 21 and a second movable electrode portion 22 that are provided with the support axis Q as a boundary therebetween. The first movable electrode portion 21 is provided in the first seesaw piece 20a. The second movable electrode portion 22 is provided in the second seesaw piece 20b.

The first movable electrode portion 21 is a portion of the movable body 20 overlapping the first fixed electrode portion 50 in the plan view. The second movable electrode portion 22 is a portion of the movable body 20 overlapping the second fixed electrode portion 52 in the plan view. In the functional element 100, the movable body 20 is composed of a conductive material (silicon doped with an impurity), whereby the movable electrode portions 21 and 22 are provided. That is, the first seesaw piece 20a functions as the first movable electrode portion 21, while the second seesaw piece 20b functions as the second movable electrode portion 22. A predetermined potential is given to the first movable electrode portion 21 and the second movable electrode portion 22 (the movable body 20).

An opening 24 is provided in the movable body 20. The opening 24 faces a region 13 of the substrate 10 between the first fixed electrode portion 50 and the first dummy electrode portion (third fixed electrode portion) 60. That is, the region 13 of the substrate 10 and the opening 24 overlap each other in the plan view. The opening 24 penetrates the movable body 20 in the Z-axis direction.

Here, the region 13 of the substrate 10 is a portion of the bottom surface 14 of the recess 12 of the substrate 10. The region 13 of the substrate 10 is a region between the first fixed electrode portion 50 and the first dummy electrode portion 60 in the plan view. The first fixed electrode portion 50, the second fixed electrode portion 52, the first dummy electrode portion 60, and the second dummy electrode portion 62 are not provided on the region 13 of the substrate 10, so that the region 13 of the substrate 10 is exposed.

The planar shape of the opening 24 is, for example, a rectangle having long sides parallel to the Y-axis and short sides parallel to the X-axis. A width W24 of the opening 24 is equal to or more than a width W13 of the region 13 of the substrate 10. In the illustrated example, the width W24 of the opening 24 is larger than the width W13 of the region 13 of the substrate 10. Here, the width W24 of the opening 24 is the size of the opening 24 in a direction of an axis (second axis, not shown) orthogonal to the support axis Q, that is, in the X-axis direction. In the illustrated example, the width W24 of the opening 24 corresponds to the length of the short side of the opening 24. Moreover, the width W13 of the region 13 is the size of the region 13 in the direction (X-axis direction) of the axis orthogonal to the support axis Q.

As shown in FIG. 1, the opening 24 overlaps the first fixed electrode portion 50, the region 13 of the substrate 10, and the first dummy electrode portion 60 in the plan view. In other words, a portion of the first fixed electrode portion 50, a portion of the region 13 of the substrate 10, and a portion of the first dummy electrode portion 60 are located inside the edge of the opening 24 in the plan view.

Although not illustrated, the opening 24 may overlap the first fixed electrode portion 50 and the region 13 of the substrate 10 but may not overlap the first dummy electrode portion 60 in the plan view. Moreover, although not illustrated, the opening 24 may overlap the first dummy electrode portion 60 and the region 13 of the substrate 10 but may not overlap the first fixed electrode portion 50 in the plan view.

Slit portions 26 that penetrate the movable body 20 are provided in the movable body 20. By providing the slit portion 26 in the movable body 20, damping (action to stop the motion of a mass body, flow resistance) occurring due to the viscosity of gas can be reduced.

The slit portions 26 are provided in both the first seesaw piece 20a and the second seesaw piece 20b. In the illustrated example, the slit portions 26 are provided in both a region 20a-1 of the first seesaw piece 20a on the end face 23a side of the opening 24 and a region 20a-2 of the first seesaw piece 20a on the support axis Q side of the opening 24 in the first seesaw piece 20a. In the region 20a-1 of the first seesaw piece 20a, a distance between the slit portion 26 and the support axis Q is larger than a distance between the opening 24 and the support axis Q in the plan view. In the region 20a-2 of the first seesaw piece 20a, a distance between the slit portion 26 and the support axis Q is smaller than a distance between the opening 24 and the support axis Q in the plan view. In the second seesaw piece 20b, a distance between the slit portion 26 and the support axis Q is smaller than a distance between the opening 24 and the support axis Q in the plan view.

The planar shape of the slit portion 26 is, for example, a rectangle having long sides parallel to the Y-axis and short sides parallel to the X-axis. A width W26 of the slit portion 26 is smaller than the width W24 of the opening 24. The width W26 of the slit portion 26 is the size of the slit portion 26 in the direction (X-axis direction) of the axis orthogonal to the support axis Q. In the illustrated example, the width W26 of the slit portion 26 corresponds to the length of the short side of the slit portion 26.

Moreover, a length L26 of the slit portion 26 is smaller than a length L24 of the opening 24. The length L26 of the slit portion 26 is the size of the slit portion 26 in a direction (Y-axis direction) of the support axis Q. In the illustrated example, the length L26 of the slit portion 26 corresponds to the length of the long side of the slit portion 26. The length L24 of the opening 24 is the size of the opening 24 in the direction (Y-axis direction) of the support axis Q. In the illustrated example, the length L24 of the opening 24 corresponds to the length of the long side of the opening 24.

A plurality of the slit portions 26 are provided. The slit portions 26 are arranged in the direction (Y-axis direction) of the support axis Q. In the illustrated example, one column is composed of seven slit portions 26 arranged in the Y-axis direction. Here, although not illustrated, when, for example, comparing the case where one slit portion having a predetermined length is provided in the movable body with the case where a plurality of slit portions are arranged in one column in the predetermined length in the movable body, substantially the same effect of reducing damping is achieved. In contrast, the mass of the movable body is naturally larger in the case where the plurality of slit portions are arranged. Hence, by arranging the plurality of slit portions 26 in the direction of the support axis Q, the mass of the movable body can be increased while reducing the damping. In the illustrated example, the slit portions 26 are provided in a plurality of columns. That is, the slit portions 26 are arranged in a plurality of rows and a plurality of columns.

A through-hole 28 in which the support portions 30 and 32 and the fixed portion 40 are disposed is provided in the movable body 20.

The support portions 30 and 32 support the movable body 20 so as to be displaceable about the support axis Q. The support portions 30 and 32 function as torsion springs. Therefore, the support portions 30 and 32 can have strong resilience against torsional deformation occurring in the support portions 30 and 32 due to the movable body 20 swinging in a seesaw manner.

The support portions 30 and 32 are disposed on the support axis Q in the plan view. The support portions 30 and 32 extend along the support axis Q. The support portion 30 extends in the positive Y-axis direction from the fixed portion 40 to the movable body 20. The support portion 32 extends in the negative Y-axis direction from the fixed portion 40 to the movable body 20. The support portions 30 and 32 connect the fixed portion 40 with the movable body 20.

The fixed portion 40 is disposed in the through-hole 28. The fixed portion 40 is provided on the support axis Q in the plan view. The fixed portion 40 is bonded to the post portion 16 of the substrate 10.

The movable body 20, the support portions 30 and 32, and the fixed portion 40 are integrally provided. The movable body 20, the support portions 30 and 32, and the fixed portion 40 are integrally provided by, for example, patterning one substrate (silicon substrate 4, refer to FIG. 4). Therefore, the movable body 20, the support portions 30 and 32, and the fixed portion 40 constitute one structure (silicon structure) 2. The material of the structure 2 is, for example, silicon doped with an impurity such as phosphorus or boron to provide conductivity. When the material of the substrate 10 is glass and the material of the structure 2 is silicon, the substrate 10 and the fixed portion 40 (the structure 2) are bonded together by, for example, anodic bonding.

The structure 2 is fixed to the substrate 10 with one fixed portion 40. That is, the structure 2 is supported at one point to the substrate 10. Hence, compared to when, for example, the structure 2 is supported at two points to the substrate 10 (when fixed to the substrate with two fixed portions), it is possible to reduce the influences of the stress generated by a difference between the thermal expansion rate of the substrate 10 and the thermal expansion rate of the structure 2, or the stress applied to a device in mounting, on the support portions 30 and 32.

The first fixed electrode portion 50 is provided on the substrate 10. The first fixed electrode portion 50 is provided on the bottom surface 14 of the recess 12. The first fixed electrode portion 50 is provided between the second fixed electrode portion 52 and the first dummy electrode portion 60 in the plan view. The first fixed electrode portion 50 is disposed such that at least a portion thereof faces the first seesaw piece 20a (the first movable electrode portion 21). That is, the first fixed electrode portion 50 and the first seesaw piece 20a (the first movable electrode portion 21) overlap each other in the plan view. A gap is provided between the first fixed electrode portion 50 and the first seesaw piece 20a (the first movable electrode portion 21).

The second fixed electrode portion 52 is provided on the substrate 10. The second fixed electrode portion 52 is provided on the bottom surface 14 of the recess 12. The second fixed electrode portion 52 is provided on the positive X-axis direction side of the first fixed electrode portion 50. The second dummy electrode portion 62 is provided between the second fixed electrode portion 52 and the first fixed electrode portion 50. The second fixed electrode portion 52 is disposed such that at least a portion thereof faces the second seesaw piece 20b (the second movable electrode portion 22). That is, the second fixed electrode portion 52 and the second seesaw piece 20b (the second movable electrode portion 22) overlap each other in the plan view. A gap is provided between the second fixed electrode portion 52 and the second seesaw piece 20b (the second movable electrode portion 22).

In the functional element 100, for example, the shape of a portion of the first fixed electrode portion 50 overlapping the movable body 20 in the plan view is symmetrical to the shape of a portion of the second fixed electrode portion 52 overlapping the movable body 20 in the plan view with respect to the support axis Q. That is, the area of the portion of the first fixed electrode portion 50 overlapping the movable body 20 in the plan view is equal to the area of the portion of the second fixed electrode portion 52 overlapping the movable body 20 in the plan view.

The first fixed electrode portion 50 and the first movable electrode portion 21 form an electrostatic capacitance C1. Moreover, the second fixed electrode portion 52 and the second movable electrode portion 22 form an electrostatic capacitance C2. For example, the electrostatic capacitance C1 and the electrostatic capacitance C2 are configured so as to be equal to each other in a horizontal sate of the movable body 20 shown in FIG. 2. The positions of the movable electrode portions 21 and 22 change in response to the motion of the movable body 20, and in response to the positions of the movable electrode portions 21 and 22, the electrostatic capacitances C1 and C2 change.

The first dummy electrode portion 60 is provided on the substrate 10. The first dummy electrode portion 60 is provided on the bottom surface 14 of the recess 12 of the substrate 10. The first dummy electrode portion 60 is provided on the negative X-axis direction side of the first fixed electrode portion 50. The first dummy electrode portion 60 is disposed to face the first seesaw piece 20a. That is, the first dummy electrode portion 60 and the first seesaw piece 20a overlap each other in the plan view.

The first dummy electrode portion 60 is electrically connected with the movable body 20 (the structure 2). The first dummy electrode portion 60 is electrically connected via the second dummy electrode portion 62 to the movable body 20 (the structure 2) through, for example, a wiring (not shown) provided on the substrate 10. The first dummy electrode portion 60 may be electrically connected with the movable body 20 (the structure 2) through, for example, a bonding wire (not shown) or the like.

The second dummy electrode portion 62 is provided on the substrate 10. The second dummy electrode portion 62 is provided on the bottom surface 14 of the recess 12 of the substrate 10. The second dummy electrode portion 62 is provided between the first fixed electrode portion 50 and the second fixed electrode portion 52. The second dummy electrode portion 62 is disposed to face a portion of the first seesaw piece 20a, a portion of the second seesaw piece 20b, and the support portions 30 and 32. That is, the second dummy electrode portion 62 overlaps a portion of the first seesaw piece 20a, a portion of the second seesaw piece 20b, and the support portions 30 and 32 in the plan view.

The second dummy electrode portion 62 is electrically connected with the movable body 20 (the structure 2). The second dummy electrode portion 62 is electrically connected with the movable body 20 via, for example, a wiring (not shown) provided on the surface of the post portion 16, the fixed portion 40, and the support portions 30 and 32.

As described above, since the first dummy electrode portion 60 and the second dummy electrode portion 62 are electrically connected with the structure 2 (the movable body 20), the dummy electrode portions 60 and 62 and the structure 2 (the movable body 20) can be at the same potential. Moreover, it is sufficient that the first dummy electrode portion 60 and the second dummy electrode portion 62 are connected to a constant potential (fixed potential or ground potential), and the first dummy electrode portion 60 and the second dummy electrode portion 62 may not be necessarily connected electrically with the structure 2.

The material of the fixed electrode portions 50 and 52 and the dummy electrode portions 60 and 62 is, for example, aluminum, gold, ITO (Indium Tin Oxide), or the like. The material of the fixed electrode portions 50 and 52 and the dummy electrode portions 60 and 62 is desirably a transparent electrode material such as ITO. With the use of a transparent electrode material as the material of the fixed electrode portions 50 and 52 and the dummy electrode portions 60 and 62, when the substrate 10 is a transparent substrate (glass substrate), it is possible to easily recognize visually a foreign substance or the like present on the fixed electrode portions 50 and 52 and on the dummy electrode portions 60 and 62.

The lid 70 is provided on the substrate 10. The lid 70 is bonded to the substrate 10. The lid 70 and the substrate 10 form a cavity 72 that accommodates the movable body 20. In the cavity 72, for example, an inert gas (for example, nitrogen gas) atmosphere is established. The material of the lid 70 is, for example, silicon. When the material of the lid 70 is silicon and the material of the substrate 10 is glass, the lid 70 and the substrate 10 are bonded together by, for example, anodic bonding.

Next, the operation of the functional element 100 will be described.

In the functional element 100, the movable body 20 swings about the support axis Q according to a physical quantity such as acceleration or angular velocity. With the motion of the movable body 20, a distance between the first movable electrode portion 21 and the first fixed electrode portion 50 and a distance between the second movable electrode portion 22 and the second fixed electrode portion 52 change.

Specifically, when vertically upward (the positive Z-axis direction) acceleration is applied to the functional element 100, the movable body 20 rotates counterclockwise, the distance between the first movable electrode portion 21 and the first fixed electrode portion 50 is reduced, and the distance between the second movable electrode portion 22 and the second fixed electrode portion 52 is increased. As a result, the electrostatic capacitance C1 is increased, while the electrostatic capacitance C2 is reduced.

Moreover, when vertically downward (the negative Z-axis direction) acceleration is applied to the functional element 100, the movable body 20 rotates clockwise, the distance between the first movable electrode portion 21 and the first fixed electrode portion 50 is increased, and the distance between the second movable electrode portion 22 and the second fixed electrode portion 52 is reduced. As a result, the electrostatic capacitance C1 is reduced, while the electrostatic capacitance C2 is increased.

Hence, it is possible in the functional element 100 to detect a physical quantity such as the direction or magnitude of acceleration, angular velocity, or the like based on a difference between the electrostatic capacitance C1 and the electrostatic capacitance C2 (by a so-called differential detection method).

As described above, the functional element 100 can be used as an inertial sensor such as an acceleration sensor or a gyro sensor, and can be used specifically as, for example, an electrostatic capacitive acceleration sensor for measuring the acceleration in the vertical direction (Z-axis direction).

The functional element 100 has, for example, the following features.

In the functional element 100, the opening 24 facing the region 13 of the substrate 10 between the first fixed electrode portion 50 and the first dummy electrode portion 60 is provided in the movable body 20, and the width W24 of the opening 24 is equal to or more than the width W13 of the region 13 of the substrate 10. Therefore, in the functional element 100, a region where the movable body 20 and the region 13 of the substrate 10 (the exposed region of the substrate 10) overlap each other can be reduced due to the opening 24. With this configuration, an electrostatic force to be generated between the movable body 20 and the substrate 10 is suppressed, so that sticking of the movable body 20 to the substrate 10 can be reduced. Hence, in the manufacture of the functional element 100 for example, it is possible to avoid the occurrence of a problem in that a potential difference occurs between the movable body 20 and the substrate 10, the movable body 20 is attracted to the substrate 10 side with an electrostatic force, and thus the movable body 20 sticks to the substrate 10.

Further, the functional element 100 includes the first dummy electrode portion 60 that is disposed on the substrate 10 so as to face the first seesaw piece 20a and electrically connected to the movable body 20. Therefore, it is possible in the functional element 100 to reduce a potential difference between the movable body 20 and the first dummy electrode portion 60 (or to eliminate the potential difference). Hence, an electrostatic force to be generated between the movable body 20 and the substrate 10 is suppressed, so that sticking of the movable body 20 to the substrate 10 can be reduced.

Further, the functional element 100 includes the second dummy electrode portion 62 that is disposed on the substrate 10 so as to face the first seesaw piece 20a, the second seesaw piece 20b, and the support portions 30 and 32 and electrically connected to the movable body 20. Therefore, it is possible in the functional element 100 to reduce a potential difference between the movable body 20 and the second dummy electrode portion 62 and a potential difference between the support portions 30 and 32 and the second dummy electrode portion 62 (or to eliminate the potential differences). Hence, an electrostatic force to be generated between the movable body 20 and the substrate 10 and an electrostatic force to be generated between the support portions 30 and 32 and the substrate 10 are suppressed, so that sticking of the movable body 20 or the support portion 30 to the substrate 10 can be reduced.

In the functional element 100 as described above, sticking of the movable body 20 to the substrate 10 can be reduced due to the opening 24 and the dummy electrode portions 60 and 62. Therefore, compared to when, for example, a stopper is provided on the surface of the movable body facing the substrate, manufacturing is easy.

In the functional element 100, the opening 24 overlaps the first fixed electrode portion 50, the region 13 of the substrate 10, and the first dummy electrode portion 60 in the plan view. Therefore, in the functional element 100, an electrostatic force to be generated between the movable body 20 and the substrate 10 is suppressed, so that sticking of the movable body 20 to the substrate 10 can be reduced. Moreover, even when, for example, the position of the opening 24 is shifted due to misalignment or the like in the manufacturing step, it is possible in the functional element 100 to allow such a position shift.

In the functional element 100, the slit portions 26 that penetrate the movable body 20 are provided in the movable body 20, the distance between the slit portion 26 and the support axis Q is larger than the distance between the opening 24 and the support axis Q, and the width W26 of the slit portion 26 is larger than the width W24 of the opening 24, in the plan view. Therefore, in the functional element 100, torque (moment of force about the support axis Q) can be gained while reducing damping in the movable body 20. Hence, for example, detection sensitivity can be increased in the functional element 100. This is because, damping does not depend on a distance from the support axis Q (or is less affected by the distance) but torque is largely affected by the distance from the support axis Q.

In the functional element 100, the length L26 of the slit portion 26 is smaller than the length L24 of the opening 24. Therefore, it is possible in the functional element 100 to increase the mass of the movable body 20 while reducing the influence of damping. With this configuration, for example, detection sensitivity can be increased.

In the functional element 100, the plurality of slit portions 26 are provided, and arranged in the direction of the support axis Q. Therefore, it is possible in the functional element 100 to increase the mass of the movable body while reducing the influence of damping. With this configuration, for example, detection sensitivity can be increased.

In the functional element 100, the opening 24 penetrates the movable body 20. Therefore, compared to when, for example, the opening 24 does not penetrate the movable body 20, it is possible to suppress an electrostatic force to be generated between the movable body 20 and the substrate 10. Hence, in the functional element 100, sticking of the movable body 20 to the substrate 10 can be more reliably reduced.

In the functional element 100, the material of the substrate 10 is glass, and the material of the movable body is silicon. Therefore, it is easily possible in the functional element 100 to electrically insulate the substrate 10 and the movable body 20 from each other, so that the structure of the functional element 100 can be simplified.

1.2. Method for Manufacturing Functional Element

Figure 3:
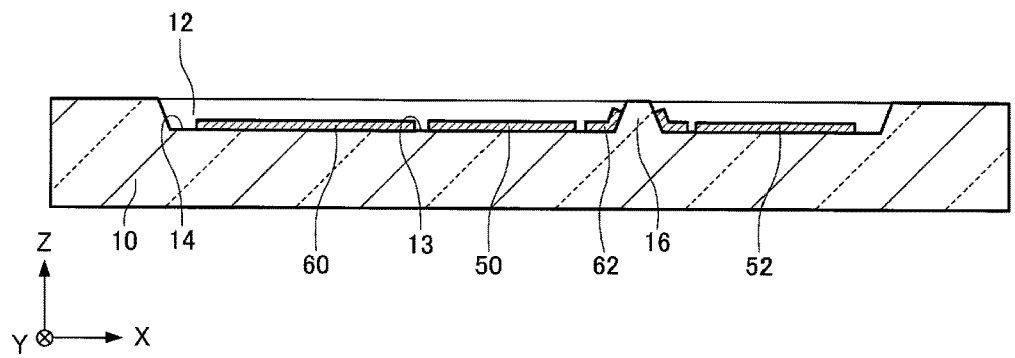
FIG. 3 is a cross-sectional view schematically showing a manufacturing step of the functional element according to the first embodiment.
Figure 4:
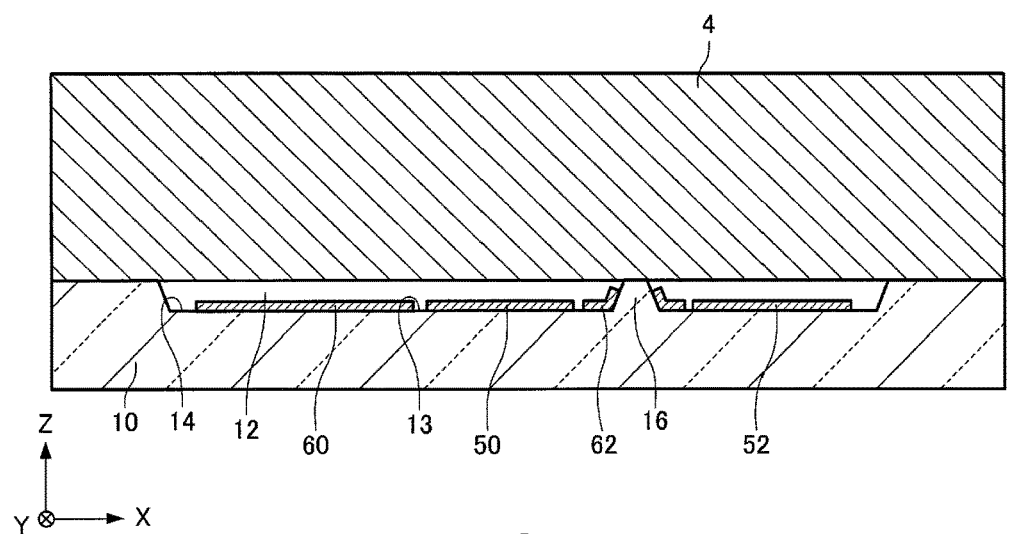
FIG. 4 is a cross-sectional view schematically showing a manufacturing step of the functional element according to the first embodiment.
Figure 5:
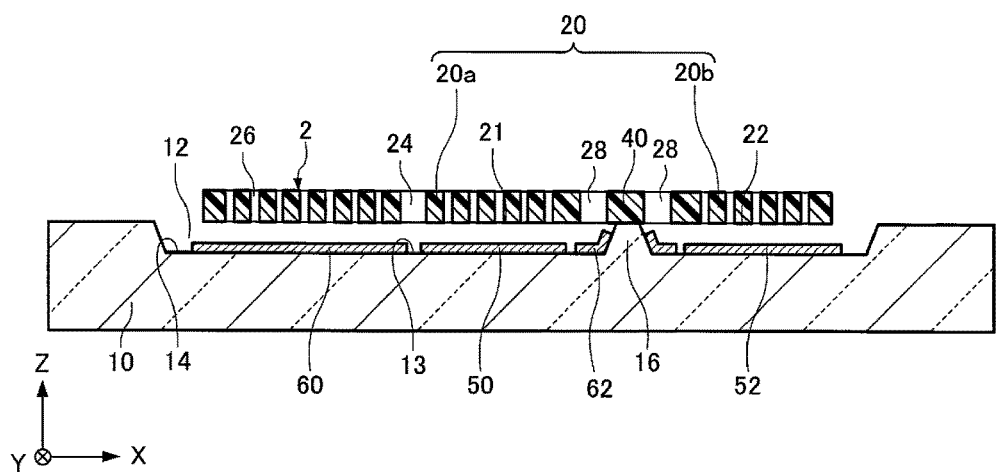
FIG. 5 is a cross-sectional view schematically showing a manufacturing step of the functional element according to the first embodiment.

Next, a method for manufacturing the functional element according to the first embodiment will be described with reference to the drawings. FIGS. 3 to 5 are cross-sectional views schematically showing manufacturing steps of the functional element 100 according to the first embodiment. FIGS. 3 to 5 correspond to FIG. 2.

As shown in FIG. 3, the substrate 10 including the recess 12 and the post portion 16 is formed by patterning, for example, a glass substrate. The patterning of the glass substrate is performed by, for example, photolithography and etching.

Next, the fixed electrode portions 50 and 52 and the dummy electrode portions 60 and 62 are formed on the bottom surface 14 of the recess 12. The fixed electrode portions 50 and 52 and the dummy electrode portions 60 and 62 are formed by depositing a conductive layer (not shown) on the bottom surface 14 of the recess 12 by a sputtering method or the like, and then patterning the conductive layer by photolithography and etching.

As shown in FIG. 4, the silicon substrate 4 is bonded to the substrate 10. The bonding of the substrate 10 and the silicon substrate 4 is performed by, for example, anodic bonding.

As shown in FIG. 5, the silicon substrate 4 is grinded by, for example, a grinding machine to be a thin film, and then patterned to integrally form the movable body 20, the support portions 30 and 32, and the fixed portion 40. With this configuration, the structure 2 is formed. Moreover, in this step, the opening 24, the slit portions 26, and the through-hole 28 are formed in the movable body 20. The patterning is performed by photolithography and etching (dry etching), and as a more specific etching technique, the Bosch method can be used.

As shown in FIG. 2, the lid 70 is bonded to the substrate 10 to accommodate the movable body 20 (the structure 2) in the cavity 72 formed of the substrate 10 and the lid 70. The bonding of the substrate 10 and the lid 70 is performed by, for example, anodic bonding. By performing this step in an inert gas atmosphere, the cavity 72 can be filled with an inert gas.

In this step, due to anodic bonding performed when bonding the lid 70 to the substrate 10, a large potential difference occurs between the structure 2 and the substrate 10. However, it is possible due to the dummy electrode portions 60 and 62 and the opening 24 to suppress an electrostatic force acting between the movable body 20 and the substrate 10 and an electrostatic force acting between the support portions 30 and 32 and the substrate 10. Hence, sticking of the movable body 20 to the substrate 10 can be reduced.

Through the steps described above, the functional element 100 can be manufactured.

1.3. Modified Example

Figure 6:
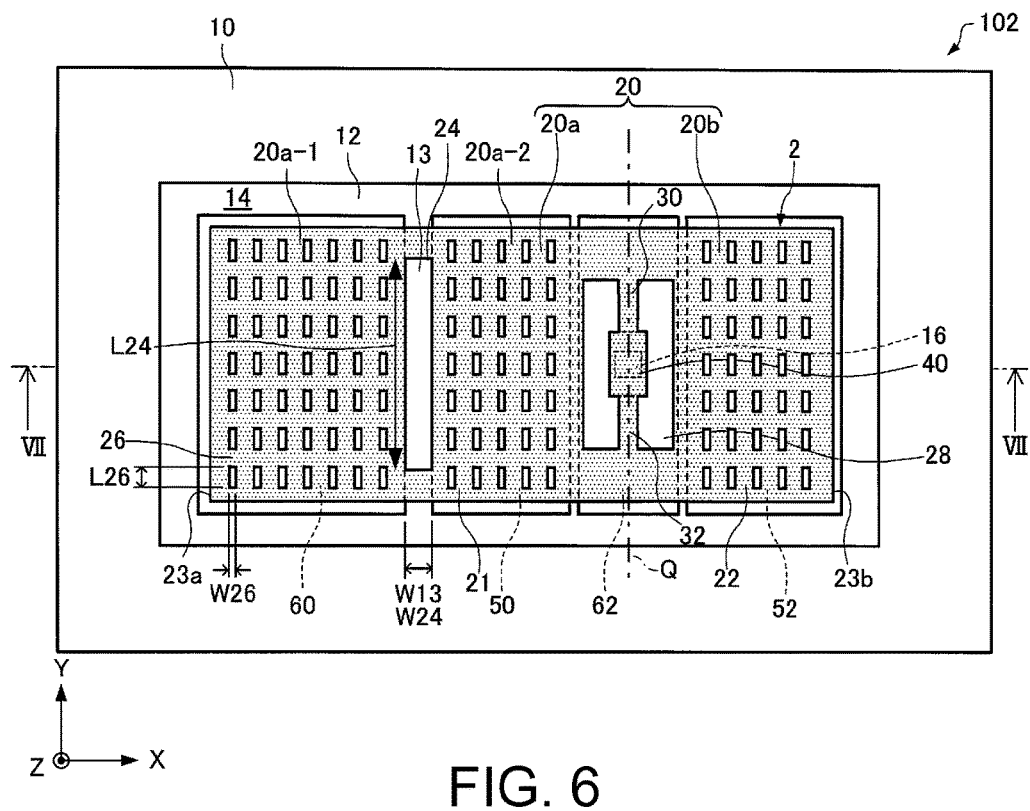
FIG. 6 is a plan view schematically showing a functional element according to a modified example of the first embodiment.
Figure 7:
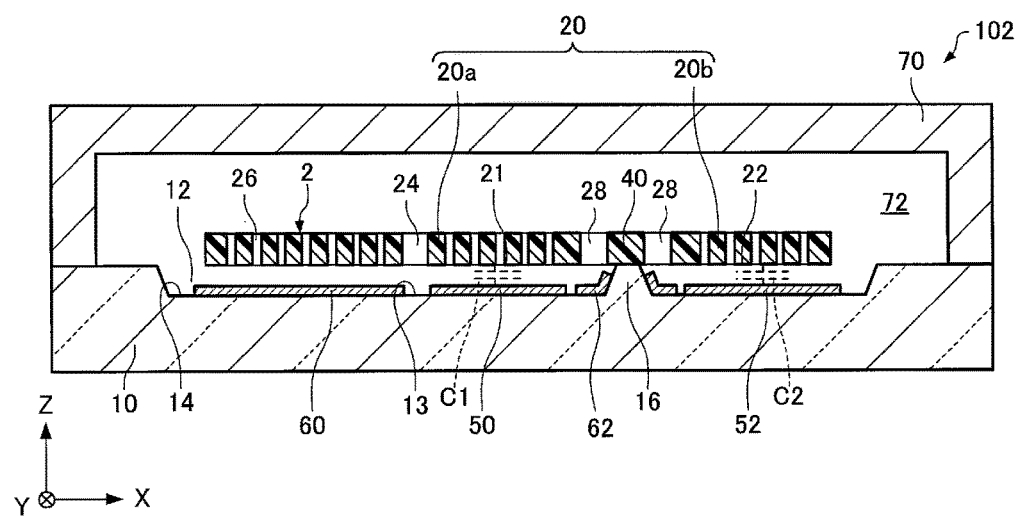
FIG. 7 is a cross-sectional view schematically showing the functional element according to the modified example of the first embodiment.

Next, a modified example of the functional element according to the first embodiment will be described with reference to the drawings. FIG. 6 is a plan view schematically showing a functional element 102 according to the modified example of the first embodiment. FIG. 7 is a cross-sectional view taken along the line VII-VII in FIG. 6, schematically showing the functional element 102 according to the modified example of the first embodiment. For convenience sake, the lid 70 is not illustrated in FIG. 6.

Hereinafter, in the functional element 102 according to the modified example of the first embodiment, members having functions similar to those of the constituent members of the functional element 100 described above are denoted by the same reference numerals and signs, and the description thereof is omitted.

In the functional element 100 as shown in FIGS. 1 and 2, the opening 24 overlaps the first fixed electrode portion 50, the region 13 of the substrate 10, and the first dummy electrode portion 60 in the plan view. That is, the width W24 of the opening 24 is larger than the width W13 of the region 13 of the substrate 10.

In contrast, in the functional element 102 as shown in FIGS. 6 and 7, the opening 24 overlaps only the region 13 of the substrate 10 in the plan view, and the width W24 of the opening 24 is equal to the width W13 of the region 13 of the substrate 10.

The planar shape of the opening 24, the planar shape of the first fixed electrode portion 50, and the planar shape of the first dummy electrode portion 60 are rectangles each having long sides parallel to the Y-axis and short sides parallel to the X-axis. In the plan view, one (the positive X-axis direction side) of the long sides of the opening 24 overlaps the long side of the first fixed electrode portion 50. Moreover, in the plan view, the other (the negative X-axis direction side) of the long sides of the opening 24 overlaps the long side of the first dummy electrode portion 60.

In the functional element 102, the opening 24 facing the region 13 of the substrate 10 between the first fixed electrode portion 50 and the first dummy electrode portion 60 is provided in the movable body 20, and the width W24 of the opening 24 is equal to the width W13 of the region 13 of the substrate 10. Therefore, in the functional element 102, an electrostatic force to be generated between the movable body 20 and the substrate 10 is suppressed, so that sticking of the movable body 20 to the substrate 10 can be reduced, similarly to the functional element 100.

Here, the description has been given of the case where the width W24 of the opening 24 is equal to the width W13 of the region 13 of the substrate 10. In contrast, although not illustrated, if the width W24 of the opening 24 is equal to or more than the width W13 of the region 13 of the substrate 10, one (the positive X-axis direction side) of the long sides of the opening 24 may overlap the long side of the first fixed electrode portion 50 but the other (the negative X-axis direction side) of the long sides of the opening 24 may not overlap the long side of the first dummy electrode portion 60 in the plan view. Moreover, although not illustrated, one (the positive X-axis direction side) of the long sides of the opening 24 may not overlap the long side of the first fixed electrode portion 50 but the other (the negative X-axis direction side) of the long sides of the opening 24 may overlap the long side of the first dummy electrode portion 60 in the plan view.

2. Second Embodiment

Figure 8:
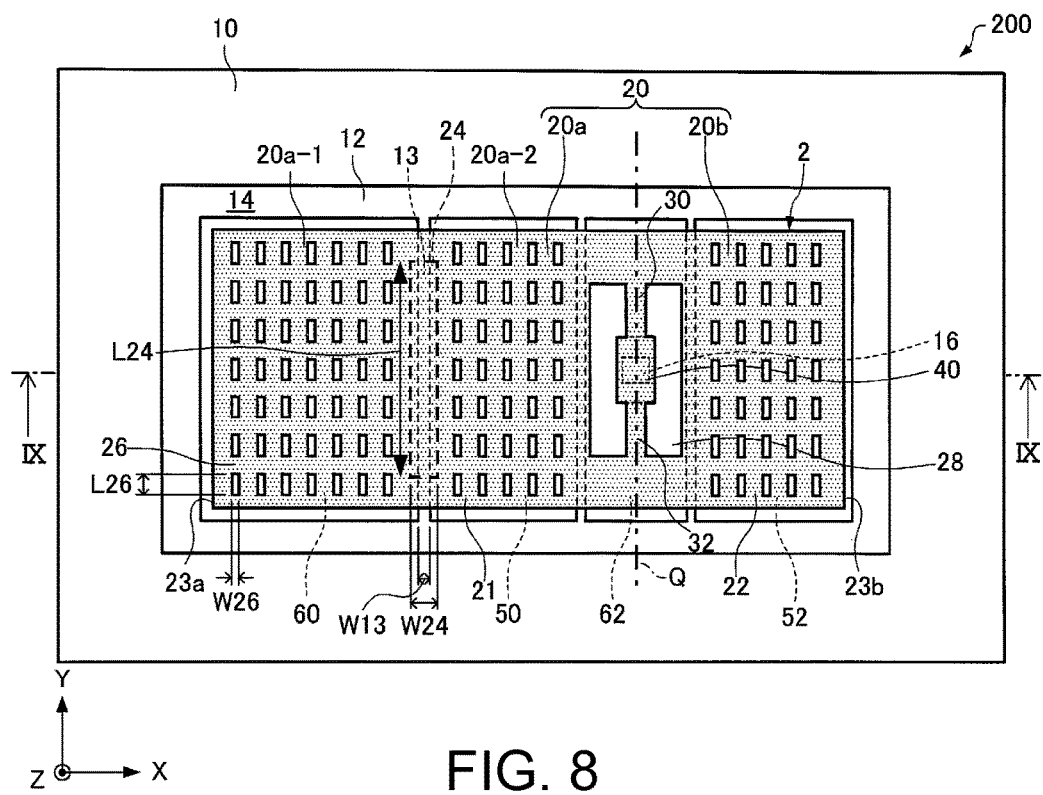
FIG. 8 is a plan view schematically showing a functional element according to a second embodiment.
Figure 9:
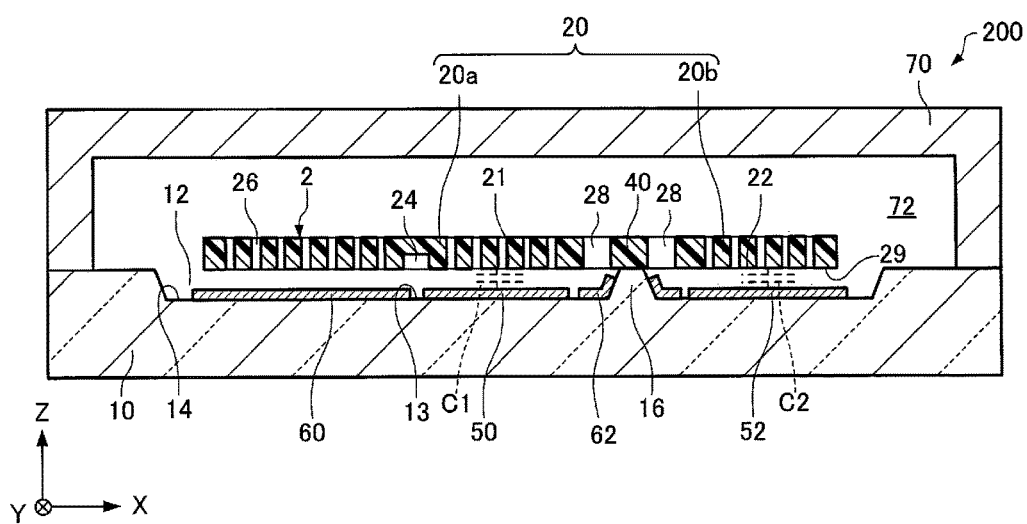
FIG. 9 is a cross-sectional view schematically showing the functional element according to the second embodiment.

Next, a functional element according to a second embodiment will be described with reference to the drawings. FIG. 8 is a plan view schematically showing a functional element 200 according to the second embodiment. FIG. 9 is a cross-sectional view taken along the line IX-IX in FIG. 8, schematically showing the functional element 200 according to the second embodiment. For convenience sake, the lid 70 is not illustrated in FIG. 8.

Hereinafter, in the functional element 200 according to the second embodiment, members having functions similar to those of the constituent members of the functional element 100 according to the first embodiment described above are denoted by the same reference numerals and signs, and the description thereof is omitted.

In the functional element 100 as shown in FIGS. 1 and 2, the opening 24 penetrates the movable body 20.

In contrast, in the functional element 200 as shown in FIGS. 8 and 9, the opening 24 is a recess provided in a surface (lower surface) 29 of the movable body 20 on the substrate 10 side. Since the opening 24 is a recess, a distance between the movable body 20 and the region 13 of the substrate 10 can be increased.

Here, the magnitude of an electrostatic force is inversely proportional to the square of a distance. Therefore, by providing the opening 24 (recess), an electrostatic force acting between the substrate 10 and the movable body 20 can be suppressed. The depth of the opening 24 is not particularly limited as long as the depth prevents the movable body 20 from sticking to the substrate 10 with an electrostatic force.

In the functional element 200, the opening 24 facing the region 13 of the substrate 10 between the first fixed electrode portion 50 and the first dummy electrode portion 60 is provided in the movable body 20, and the width W24 of the opening 24 is equal to or more than the width W13 of the region 13 of the substrate 10. Therefore, in the functional element 200, an electrostatic force to be generated between the movable body 20 and the substrate 10 is suppressed, so that sticking of the movable body 20 to the substrate 10 can be reduced, similarly to the functional element 100.

Further, in the functional element 200, the opening 24 is a recess provided in the lower surface 29 of the movable body 20. Therefore, compared to when, for example, the opening 24 penetrates the movable body 20, the mass of the movable body 20 can be increased in the functional element 200.

The modified example of the first embodiment is applied similarly to the second embodiment.

3. Third Embodiment

Next, electronic apparatuses according to a third embodiment will be described with reference to the drawings. The electronic apparatuses according to the third embodiment each include the functional element according to the invention. Hereinafter, electronic apparatuses each including the functional element 100 as the functional element according to the invention will be described.

Figure 10:
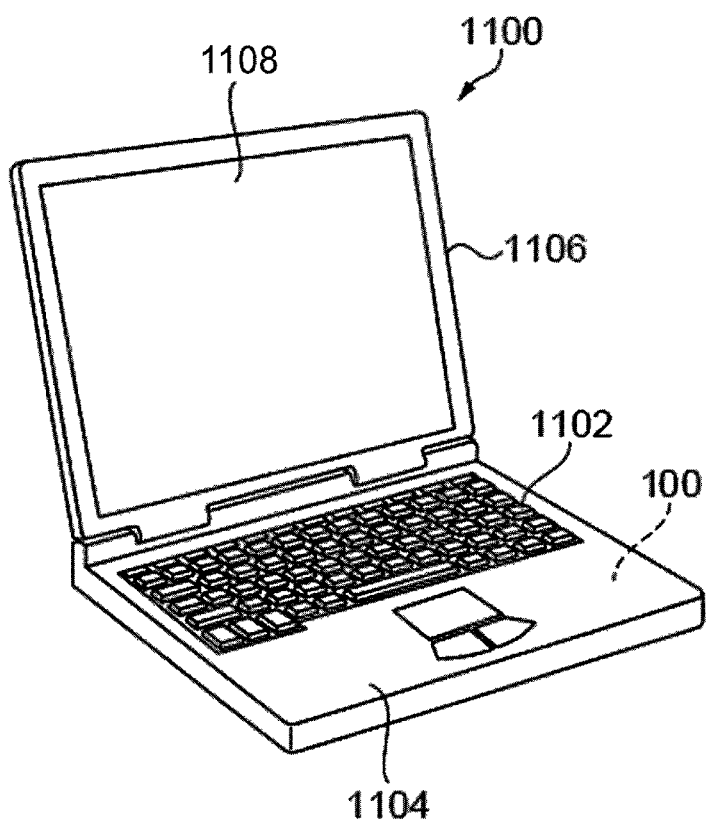
FIG. 10 is a perspective view schematically showing an electronic apparatus according to a third embodiment.

FIG. 10 is a perspective view schematically showing a mobile (or notebook) personal computer 1100 as an electronic apparatus according to the third embodiment.

As shown in FIG. 10, the personal computer 1100 is composed of a main body portion 1104 including a keyboard 1102, and a display unit 1106 including a display portion 1108. The display unit 1106 is rotatably supported relative to the main body portion 1104 via a hinge structure portion.

Into the personal computer 1100, the functional element 100 is built.

Figure 11:
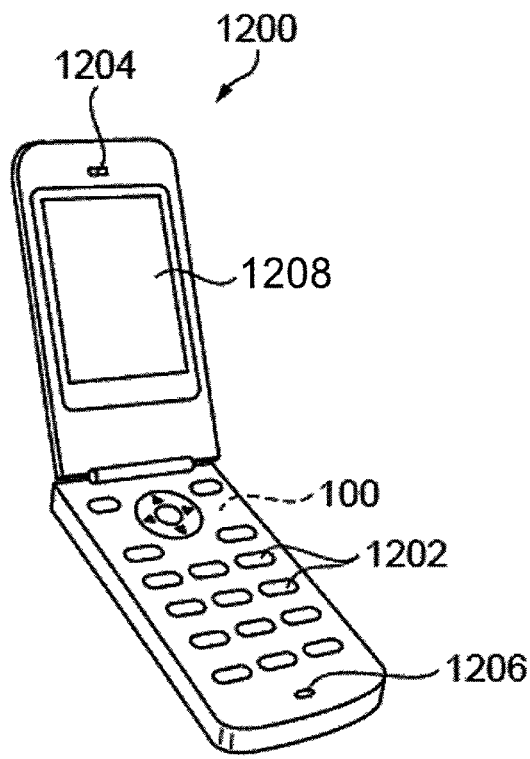
FIG. 11 is a perspective view schematically showing an electronic apparatus according to the third embodiment.

FIG. 11 is a perspective view schematically showing a mobile phone (including a PHS) 1200 as an electronic apparatus according to the third embodiment.

As shown in FIG. 11, the mobile phone 1200 includes a plurality of operation buttons 1202, an earpiece 1204, and a mouthpiece 1206. A display portion 1208 is disposed between the operation buttons 1202 and the earpiece 1204.

Into the mobile phone 1200, the functional element 100 is built.

Figure 12:
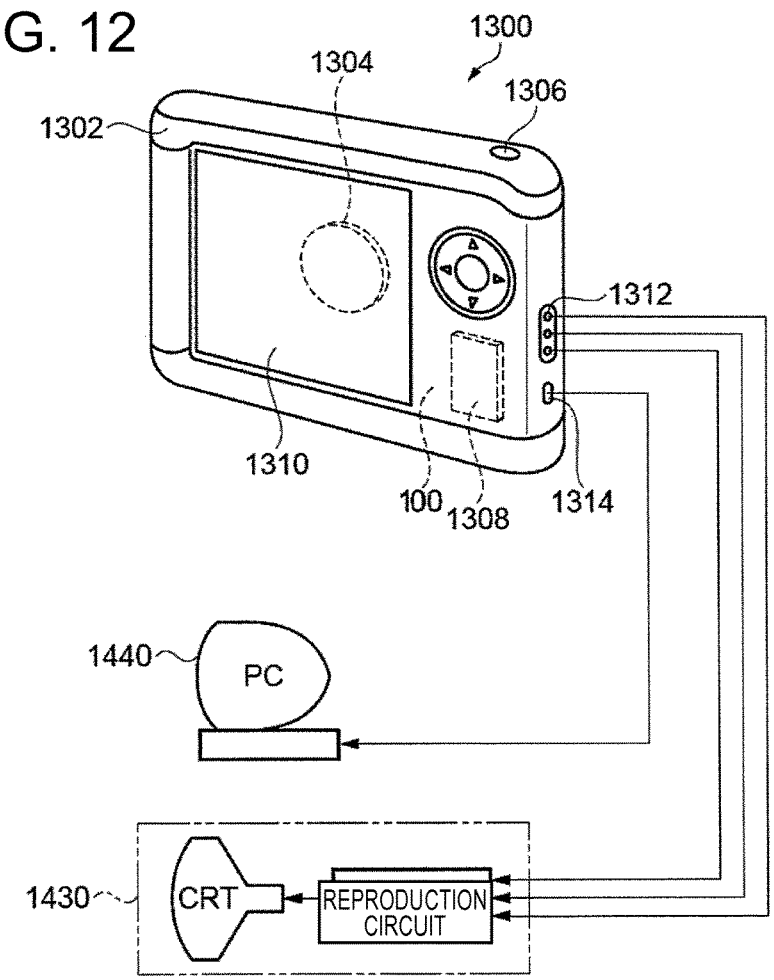
FIG. 12 is a perspective view schematically showing an electronic apparatus according to the third embodiment.

FIG. 12 is a perspective view schematically showing a digital still camera 1300 as an electronic apparatus according to the third embodiment. In FIG. 12, connections with external apparatuses are also shown in a simplified manner.

Here, usual cameras expose a silver halide photographic film with an optical image of a subject, whereas the digital still camera 1300 photoelectrically converts the optical image of the subject with an imaging element such as a CCD (Charge Coupled Device) to generate imaging signals (image signals).

A display portion 1310 is provided on a back surface of a case (body) 1302 in the digital still camera 1300 and configured to perform display based on imaging signals generated by the CCD. The display portion 1310 functions as a finder that displays the subject as an electronic image.

Moreover, on the front side (the rear side in the drawing) of the case 1302, a light receiving unit 1304 including an optical lens (imaging optical system) and the CCD is provided.

When a photographer confirms the subject image displayed on the display portion 1310 and presses down a shutter button 1306, imaging signals of the CCD at the time are transferred to and stored in a memory 1308.

In the digital still camera 1300, a video signal output terminal 1312 and a data communication input/output terminal 1314 are provided on a side surface of the case 1302. Then, a television monitor 1430 and a personal computer 1440 are connected as necessary to the video signal output terminal 1312 and the data communication input/output terminal 1314, respectively. Further, the imaging signals stored in the memory 1308 are output to the television monitor 1430 or the personal computer 1440 by a predetermined operation.

Into the digital still camera 1300, the functional element 100 is built.

The electronic apparatuses 1100, 1200, and 1300 described above each include the functional element 100 in which sticking of the movable body 20 to the substrate 10 can be reduced, and therefore can have high reliability.

In addition to the personal computer (mobile personal computer) shown in FIG. 10, the mobile phone shown in FIG. 11, and the digital still camera shown in FIG. 12, an electronic apparatus including the functional element 100 can be applied to, for example, inkjet ejection apparatus (for example, inkjet printers), laptop personal computers, television sets, video camcorders, video tape recorders, car navigation systems, pagers, electronic notebooks (including those with communication function), electronic dictionaries, calculators, electronic gaming machines, head-mounted displays, word processors, workstations, videophones, surveillance television monitors, electronic binoculars, POS terminals, medical apparatuses (for example, electronic thermometers, sphygmomanometers, blood glucose meters, electrocardiogram measuring systems, ultrasonic diagnosis apparatuses, and electronic endoscopes), fishfinders, various types of measuring instrument, indicators (for example, indicators used in vehicles, aircraft, rockets, and ships), attitude control of robots, the human body, or the like, and flight simulators.

4. Fourth Embodiment

Next, a moving object according to a fourth embodiment will be described with reference to the drawing. The moving object according to the fourth embodiment includes the functional element according to the invention. Hereinafter, a moving object including the functional element 100 as the functional element according to the invention will be described.

Figure 13:
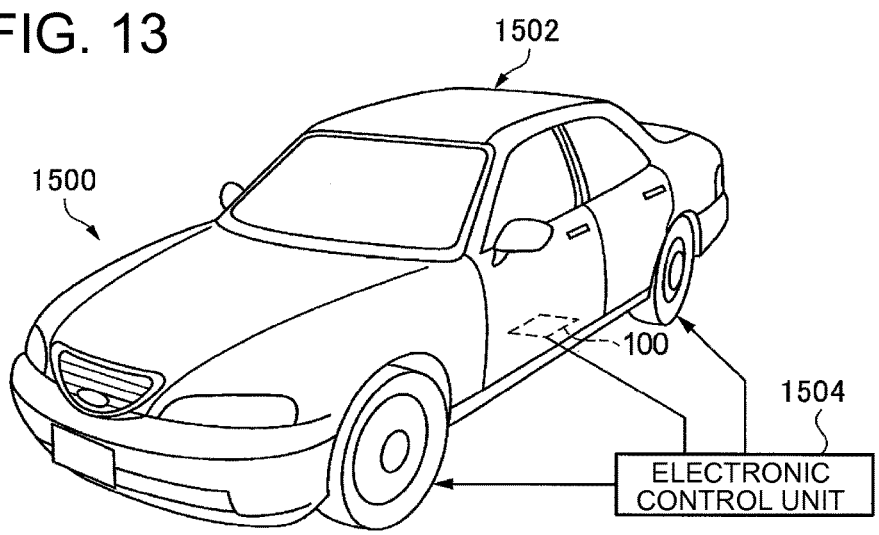
FIG. 13 is a perspective view schematically showing a moving object according to a fourth embodiment.

FIG. 13 is a perspective view schematically showing an automobile 1500 as the moving object according to the fourth embodiment.

Into the automobile 1500, the functional element 100 is built. Specifically, as shown in FIG. 13, an electronic control unit (ECU) 1504 into which the functional element 100 that detects the acceleration of the automobile 1500 is built to control an output of an engine is mounted in a car body 1502 of the automobile 1500. In addition, the functional element 100 can be widely applied to car body attitude control units, anti-lock brake systems (ABSs), air bags, and tire pressure monitoring systems (TPMSs).

The automobile 1500 includes the functional element 100 in which sticking of the movable body 20 to the substrate 10 can be reduced, and therefore can have high reliability.

The invention is not limited to the embodiments described above, and various modifications can be implemented within the scope of the gist of the invention.

For example, although the embodiments have been described in which the functional element is an acceleration sensor (physical quantity sensor) that detects acceleration in the Z-axis direction, the functional element according to the invention may be an acceleration sensor that detects acceleration in the Y-axis direction, or an acceleration sensor that detects acceleration in the X-axis direction. Moreover, the functional element according to the invention is not limited to an acceleration sensor, and may be, for example, a gyro sensor that detects angular velocity. Moreover, the functional element according to the invention may be an element other than a sensor such as an acceleration sensor or an angular velocity sensor, and may be, for example, a MEMS (Micro Electro Mechanical Systems) vibrator or the like.

Moreover, for example, in the functional element 100 according to the first embodiment and the functional element 200 according to the second embodiment, the movable body 20 is fixed to the substrate 10 with one fixed portion 40 as shown in FIGS. 1 and 8. The functional element according to the invention is not limited to this, and may be fixed to the substrate with, for example, two fixed portions. For example, a fixed portion may be provided on both sides of the movable body in the plan view, and each of the fixed portions and the movable body may be connected with a support portion, whereby the movable body may be supported. Even with such a functional element, operational effects similar to those of the functional element 100 and the functional element 200 described above can be provided.

The embodiments and modified example described above are illustrative only, and the invention is not limited to them. For example, each of the embodiments and the modified example can be appropriately combined with each other.

The invention includes a configuration (for example, a configuration having the same function, method, and result, or a configuration having the same advantage and effect) that is substantially the same as those described in the embodiments. Moreover, the invention includes a configuration in which a non-essential portion of the configurations described in the embodiments is replaced. Moreover, the invention includes a configuration providing the same operational effects as those described in the embodiments, or a configuration capable of achieving the same advantages. Moreover, the invention includes a configuration in which a publicly known technique is added to the configurations described in the embodiments.

What is claimed is:

1. A functional element comprising:
   a substrate;
   a movable body that includes a movable electrode;
   a support portion that supports the movable body so as to be displaceable about a first axis, wherein the movable body is divided into a first portion and a second portion separated by the first axis;
   a first fixed electrode that is disposed on the substrate and at least a portion of which faces the first portion of the movable body;
   a second fixed electrode that is disposed on the substrate and at least a portion of which faces the second portion of the movable body; and
   a third fixed electrode that is disposed on the substrate and at least a portion of which faces the first portion of the movable body, wherein
   the first fixed electrode is disposed between the second fixed electrode and the third fixed electrode in a plan view,
   an opening is provided in the movable body that faces a region of the substrate between the first fixed electrode and the third fixed electrode and partially overlaps both of the first fixed electrode and the third fixed electrode, wherein the opening includes a length extending in a direction parallel to the first axis and a width extending in a direction perpendicular to the first axis, the length being greater than the width,
   the width of the opening in the movable body is equal to or more than the width of the region in the substrate, and
   the second fixed electrode and the third fixed electrode each extend beyond a perimeter of the movable body on three sides in the plan view, with a width of the second fixed electrode and a width of the third fixed electrode each being greater than a width of the movable body such that the second fixed electrode and the third fixed electrode each extend beyond the movable body on opposite ends.

2. The functional element according to claim 1, wherein the third fixed electrode is electrically connected with the movable body.

3. An electronic apparatus comprising the functional element according to claim 2.

4. A moving object comprising the functional element according to claim 2.

5. The functional element according to claim 1, wherein a slit that penetrates the movable body is provided in the movable body, a distance between a portion of the slit and the first axis is larger than a distance between the opening and the first axis in the plan view, and the width of the slit is smaller than the width of the opening.

6. The functional element according to claim 5, wherein the length of the slit is smaller than the length of the opening.

7. An electronic apparatus comprising the functional element according to claim 6.

8. A moving object comprising the functional element according to claim 6.

9. The functional element according to claim 5, wherein a plurality of the slits are provided, and arranged in a direction of the first axis.

10. An electronic apparatus comprising the functional element according to claim 5.

11. A moving object comprising the functional element according to claim 5.

12. The functional element according to claim 1, wherein the opening penetrates the movable body.

13. The functional element according to claim 1, wherein the opening is a recess that is provided in a surface of the movable body on the substrate side.

14. The functional element according to claim 1, wherein the material of the substrate is glass, and the material of the movable body is silicon.

15. The functional element according to claim 1, wherein the width of the opening is the size of the opening in a direction of a second axis orthogonal to the first axis, and the width of the region is the size of the region in the direction of the second axis.

16. An electronic apparatus comprising the functional element according to claim 1.

17. A moving object comprising the functional element according to claim 1.

18. The functional element according to claim 1, further comprising a dummy electrode disposed between the first fixed electrode and the second fixed electrode in the plan view, wherein a width of the dummy electrode is greater than the width of the movable body such that the dummy electrode extends beyond the movable body on opposite ends in the plan view.

19. The functional element according to claim 1, wherein a plurality of slits that penetrate the movable body is provided in the movable body, each of the plurality of slits includes a length extending in the direction parallel to the first axis and the width extending in a direction perpendicular to the first axis, the length being greater than the width, and at least two of the plurality of slits being disposed in the length direction along the opening and at least two of the plurality of slits being disposed in the width direction on the movable body.

* * * * *